(12) United States Patent
Park et al.

(10) Patent No.: US 10,157,968 B2
(45) Date of Patent: Dec. 18, 2018

(54) DISPLAY DEVICE INCLUDING WHITE LIGHT-EMITTING LAYER

(71) Applicant: LG DISPLAY CO., LTD., Seoul (KR)

(72) Inventors: ChooJin Park, Seoul (KR); Sung-Bin Shim, Yangsan-si (KR); Hye-Sook Kim, Seoul (KR); Moon-Bae Gee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 34 days.

(21) Appl. No.: 15/381,718

(22) Filed: Dec. 16, 2016

(65) Prior Publication Data

US 2018/0033828 A1 Feb. 1, 2018

(30) Foreign Application Priority Data

Jul. 29, 2016 (KR) .......................... 10-2016-0097547

(51) Int. Cl.
*H01L 51/52* (2006.01)
*H01L 27/32* (2006.01)
*H01L 25/04* (2014.01)

(52) U.S. Cl.
CPC .......... *H01L 27/322* (2013.01); *H01L 25/048* (2013.01); *H01L 27/3209* (2013.01); *H01L 27/3213* (2013.01); *H01L 27/3246* (2013.01); *H01L 51/5218* (2013.01); *H01L 51/5234* (2013.01)

(58) Field of Classification Search
CPC ... H01L 51/52; H01L 51/521; H01L 51/5218; H01L 51/523; H01L 51/5234; H01L 27/32; H01L 27/322; H01L 27/321; H01L 27/3213; H01L 27/324; H01L 27/3246; H01L 25/04; H01L 25/048
USPC .......................................................... 257/40
See application file for complete search history.

(56) References Cited

U.S. PATENT DOCUMENTS

| | | | |
|---|---|---|---|
| 2005/0093434 A1 | 5/2005 | Suh et al. | |
| 2006/0231842 A1 | 10/2006 | Hirakata et al. | |
| 2009/0072693 A1 | 3/2009 | Cok et al. | |
| 2014/0332762 A1* | 11/2014 | Kim | H01L 51/5271 257/40 |

FOREIGN PATENT DOCUMENTS

| | | |
|---|---|---|
| JP | 2005-100939 A | 4/2005 |
| JP | 2006-278257 A | 10/2006 |
| JP | 2006-302626 A | 11/2006 |

(Continued)

*Primary Examiner* — Monica D Harrison
(74) *Attorney, Agent, or Firm* — Birch, Stewart, Kolasch & Birch, LLP (57) ABSTRACT

A display device according to an embodiment can include a plurality of pixel areas disposed on a lower substrate, each pixel area including a plurality of sub-pixel areas for displaying images. The display device further includes a plurality of light emitting structures disposed respectively in the sub-pixel areas of each pixel area and configured to output at least one color light, a plurality of color filters disposed correspondingly to the light emitting structures and configured to convert the at least one color light output from the light emitting structures into different color lights, and a white light emitting structure configured to output white color light, wherein the white light emitting structure covers all the light emitting structures and the color filters.

20 Claims, 3 Drawing Sheets

(56) References Cited

FOREIGN PATENT DOCUMENTS

| | | |
|---|---|---|
| JP | 2010-56017 A | 3/2010 |
| JP | 2010-539653 A | 12/2010 |
| JP | 2015-62194 A | 4/2015 |
| TW | 200505282 A | 2/2005 |
| TW | 200718266 A | 5/2007 |
| WO | WO 2016/158074 A1 | 10/2016 |
| WO | WO 2016/185781 A1 | 11/2016 |

* cited by examiner

DISPLAY DEVICE INCLUDING WHITE LIGHT-EMITTING LAYER

This application claims the priority benefit of Korean Patent Application No. 10-2016-0097547, filed on Jul. 29, 2016, which is hereby incorporated by reference as if fully set forth herein.

BACKGROUND OF THE INVENTION

Field of the Invention

The present invention relates to a display device including a white light-emitting layer for realizing white color.

Discussion of the Related Art

Generally, electronic apparatuses, such as monitors, TVs, laptop computers, and digital cameras, comprise display device(s) for displaying images. For example, the display device may be a liquid crystal display device, an organic light-emitting display device, and the like.

The display device may include a plurality of pixel areas. Each pixel area may include sub-pixel areas for realizing different colors. For example, each pixel area in the display device may include a blue sub-pixel area, a red sub-pixel area, a green sub-pixel area, and a white sub-pixel area, which are all adjacent to each other and which do not overlap with each other.

A light-emitting structure including a lower electrode, a light-emitting layer and an upper electrode, which are sequentially stacked, may be disposed on each of the sub-pixel areas in the display device. For example, the light-emitting layer of the light-emitting structure may be an organic light-emitting layer. In such a light-emitting structure, the lower electrode or the upper electrode may be formed of a transparent material depending on the direction in which the light generated from the light-emitting layer is emitted. For example, each light-emitting structure of a top emission type display device may comprise an upper electrode formed of a transparent material and a lower electrode formed of a material having high reflectivity.

In the display device, a transparent white organic light-emitting layer may be disposed only in the white sub-pixel area, or a color filter, which has a different color from the other sub-pixel areas, may not be used in the white sub-pixel area. As a result, in these white sub-pixel areas of the display device according to the related art, incident light from the external environment may be reflected from an electrode (e.g., lower or upper electrode) made of a material having high reflectivity, and may be emitted outside. Thus, the display device has a problem in that the display device's definition (e.g., image resolution, image details, etc.) is deteriorated due to the reflection of external light that occurs in the white sub-pixel areas.

In order to address such reflection of external light, the display device may further include a polarizing plate, which is disposed on the outer surface of a substrate through which the light generated from the light-emitting layer is emitted. However, in such a display device, there is a problem in that the light emission efficiency of the display device is deteriorated due to the low transmittance of the polarizing plate.

Further, if a display device does not include white sub-pixel areas for realizing white color in order to prevent the above-described reflection of external light, all of the sub-pixel areas must be driven in order for the display device realize white color, thereby increasing power consumption by the display device and reducing the lifespan of the display device.

SUMMARY OF THE INVENTION

The embodiments of the present invention provide a display device including a white light-emitting layer, which address the above problems and other limitations associated with the related art.

In an embodiment, the present invention provides a plurality of pixel areas disposed on a lower substrate, each pixel area including a plurality of sub-pixel areas for displaying images; a plurality of light emitting structures disposed respectively in the sub-pixel areas of each pixel area, and configured to output at least one color light; a plurality of color filters disposed correspondingly to the light emitting structures, and configured to convert the at least one color light output from the light emitting structures into different color lights; and a white light emitting structure configured to output white color light, wherein the white light emitting structure covers all the light emitting structures and the color filters.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

The details of the above objects, technical configurations, and effects of the present invention will be clearly understood from the following detailed description taken in conjunction with the accompanying drawings showing embodiments of the present invention. Although preferred embodiments of the present invention will be described, it will be apparent that the technical spirit of the present invention can be practiced by those skilled in the art without being restricted or limited to the embodiments.

Further, in the drawings, the length and thickness of layers or areas may be exaggerated for the sake of convenience. In addition, when a first element is referred to as being "on" a second element, it can be directly on (i.e., in contact with) the second element or be indirectly on the second element with a third element interposed therebetween.

It will be understood that the terms "first" and "second" are used herein to describe various elements and are only used to distinguish one element from another element. Thus, a first element may be termed a second element, and similarly, a second element may be termed a first element without departing from the teachings of the present invention.

Terms used in the following description are used only to describe the specific embodiments and are not intended to restrict the present invention. The expression of singularity includes a plural meaning unless the singularity expression is explicitly different in context. In the specification, the terms "comprising," "including," and "having" shall be understood to designate the presence of particular features, numbers, steps, operations, elements, parts, or combinations thereof but not to preclude the presence or addition of one or more other features, numbers, steps, operations, elements, parts, or combinations thereof.

Unless otherwise defined, terms used herein, which include technical or scientific terms, preferably can have the same meanings as those generally appreciated by those skilled in the art. The terms, such as ones defined in common dictionaries, may be interpreted as having the same meanings as terms in the context of pertinent technology, and may not be interpreted as having ideal or excessively formal meanings unless clearly defined in the specification.

Figure 1:
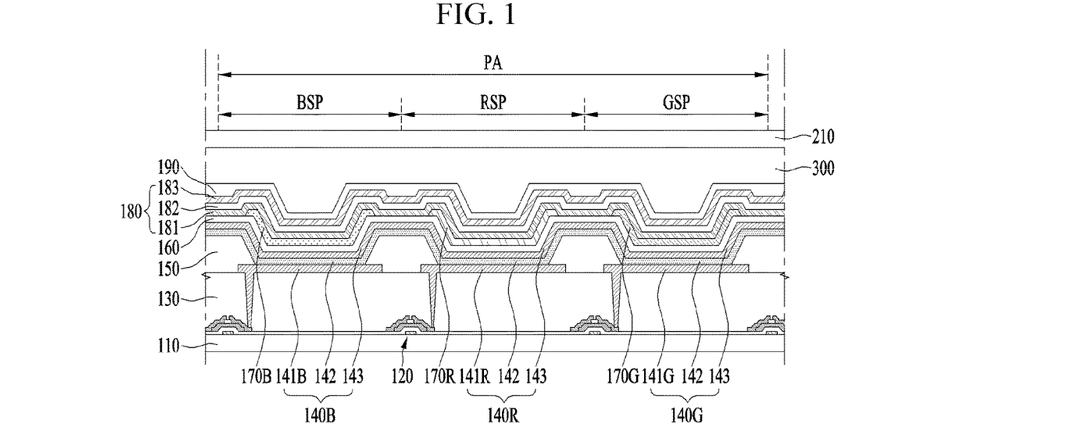
FIG. 1 is a view schematically showing a section of a display device according to an embodiment of the present invention.

FIG. 1 is a view schematically showing a section of a display device according to an embodiment of the present invention. All the components of the display device according to this and all other embodiments of the present invention are operatively coupled and configured. Further the display device according to all embodiments of the present invention can be an organic light emitting diode (OLED) display device or other types of display devices.

Referring to FIG. 1, a display device according to the embodiment of the present invention may comprise a lower substrate 110, thin film transistors 120, light-emitting structures 140B, 140R and 14G, color filters 170B, 170R and 170G, a white light-emitting structure 180, and an upper substrate 210.

The lower substrate 110 may support the thin film transistors 120, the light-emitting structures 140B, 140R and 14G, the color filters 170B, 170R and 170G, and the white light-emitting structure 180. The lower substrate 110 may include an insulating material and/or a transparent material. For example, the lower substrate 110 may include glass or plastic.

The lower substrate 110 may include a plurality of pixel areas PAs which may be arranged in a grid configuration or other type of configuration. Each pixel area PA may include sub-pixel areas BSP, RSP and GSP, which realize different colors. For example, each pixel area PA may include a blue sub-pixel area BSP, a red sub-pixel area RSP and a green sub-pixel area GSP.

The display device according to the embodiment of the present invention is described as having a constitution in which each of the pixel areas PAs includes three sub-pixel areas BSP, RSP and GSP. However, a display device according to another example of the present invention may be constituted such that each pixel area PA includes two sub-pixel areas or each pixel area PA includes four or more sub-pixel areas. Other variations are possible.

The thin film transistors 120 may be disposed on the surface of the lower substrate 110 facing the upper substrate 210. For example, the thin film transistors 120 may be uniformly positioned in the corresponding sub-pixel areas BSP, RSP and GSP of the lower substrate 110.

Each of the thin film transistors 120 may include a gate electrode disposed adjacent to the lower substrate 110, a gate insulating film on the gate electrode, a semiconductor pattern on the gate insulating film, a source electrode connected to one side portion of the semiconductor pattern, and a drain electrode connected to the opposite side portion of the semiconductor pattern. Each of the thin-film transistors 120 may further include an etch stopper interposed between the source electrode and the drain electrode in order to cover the semiconductor pattern. Each thin film transistor 120 can include any known thin film transistor structure.

For example, the display device according to the embodiment of the present invention is described as having a constitution in which the thin-film transistors 120 are in direct contact with the lower substrate 110. However, a display device according to another example of the present invention may further include a buffer layer interposed between the lower substrate 110 and the thin-film transistors 120. The buffer layer may include an insulating material. For example, the buffer layer may include silicon oxide.

The display device according to the embodiment of the present invention is described as having a constitution in which each of the thin-film transistors 120 includes the semiconductor pattern on the gate electrode. However, a display device according to another example of the present invention may be constituted such that the gate electrode of each of the thin-film transistors 120 is positioned on the upper surface of a semiconductor pattern of the thin-film transistor 120.

The display device according to the embodiment of the present invention may further include a planarization film 130 for burying irregular contours of the thin-film transistors 120. For example, the upper surface of the planarization film 130 may be parallel or substantially parallel to the upper surface of the lower substrate 110 facing the upper substrate 210. The thin-film transistors 120 may be covered by the planarization film 130. The planarization film 130 may include an insulating material. For example, the planarization film 130 may include silicon oxide.

The light-emitting structures 140B, 140R and 140G may respectively realize specific colors. For example, each of the light-emitting structures 140B, 140R and 140G may include a lower electrode 141B, 141R and 141G, a light-emitting layer 142, and an upper electrode 143, which are sequentially stacked.

Each of the light-emitting structures 140B, 140R and 140G may be disposed in a corresponding one of the sub-pixel areas BSP, RSP and GSP of the lower substrate 110. For example, the light-emitting structures 140B, 140R and 140G may include a blue light-emitting structure 140B in the blue sub-pixel area BSP of the lower substrate 110, a red light-emitting structure 140R in the red sub-pixel area RSP of the lower substrate 110, and a green light-emitting structure 140G in the green sub-pixel area GSP of the lower substrate 110.

The light-emitting structures 140B, 140R and 140G may be selectively operated to generate light of a specific color by the corresponding thin-film transistor 120. Each of the lower electrodes 141B, 141R and 141G of the light-emitting structures 140B, 140R and 140G may be electrically connected to the thin-film transistor 120 in a corresponding one of the sub-pixel areas BSP, RSP and GSP. For example, the lower electrode 141B of the blue light-emitting structure 140B may be electrically connected to the thin-film transistor 120 in the blue sub-pixel area BSP. The lower electrode 141R of the red light-emitting structure 140R may be electrically connected to the thin-film transistor 120 in the red sub-pixel area RSP. The lower electrode 141G of the green light-emitting structure 140G may be electrically connected to the thin-film transistor 120 in the green sub-pixel area GSP. For example, the planarization film 130 may include contact holes to expose the drain electrodes of the thin-film transistors 120 therethrough so that these drain electrodes may be in direct contact with the corresponding lower electrodes 141B, 141R and 141G of the light-emitting structures for electrical connection.

Each of the lower electrodes 141B, 141R and 141G of the light-emitting structures 140B, 140R and 140G may include a material having high reflectivity. Each of the lower electrodes 141B, 141R and 141G of the light-emitting structures 140B, 140R and 140G may have a multi-layer structure. Each of the lower electrodes 141B, 141R and 141G of the light-emitting structures 140B, 140R and 140G may have a constitution in which a reflective electrode and a transparent conductive material are sequentially stacked. The reflective electrode may include a metal material such as aluminum. The transparent electrode may include a transparent conductive material such as ITO or IZO.

The lower electrodes 141B, 141R and 141G of the light-emitting structures 140B, 140R and 140G may be spaced apart from one another. The lower electrodes 141B, 141R and 141G of the light-emitting structures 140B, 140R and 140G may be electrically insulated from one another. For example, the display device according to the embodiment of the present invention may further include bank insulating films 150 for insulating the lower electrodes 141B, 141R and 141G of the light-emitting structures 140B, 140R and 140G from one another. The bank insulating films 150 may cover the edges of the lower electrodes 141B, 141R and 141G of the light-emitting structures 140B, 140R and 140G. The bank insulting films 150 may include an insulating material. For example, the bank insulating films 150 may include an organic material such as benzocyclobutene (BCB), polyimide or photo-acryl.

The light-emitting structures 140B, 140R and 140G may realize the same color in the sub-pixel areas BSP, RSP and GSP. For example, the light-emitting structures 140B, 140R and 140G, which are respectively disposed in the corresponding sub-pixel areas BSP, RSP and GSP, may include light-emitting layers 142, which are formed of the same material as one another. For example, the light-emitting layers 142 of the light-emitting structures 140B, 140R and 140G may be connected to one another or may be one layer extending over all the sub-pixel areas. The light-emitting structures 140B, 140R and 140G may include light-emitting layers 142, which extend over the sub-pixel areas BSP, RSP and GSP of each pixel area PA. The light-emitting layers 142 of the light-emitting structures 140B, 140R and 140G may extend over the bank insulating films 150. For example, the light-emitting layers 142 of the light-emitting structures 140B, 140R and 140G may realize white color (e.g., by emitting white color light).

Each of the light-emitting layers 142 of the light-emitting structures 140B, 140R and 140G may include an emitting material layer (EML) including a light-emitting material. The light-emitting material may include an organic material, an inorganic material, or a hybrid material. For example, the display device according to the embodiment of the present invention may be an organic light-emitting display device including an organic light-emitting layer.

Each of the light-emitting layers 142 of the light-emitting structures 140B, 140R and 140G may have a multi-layer structure in order to enhance the light emission efficiency thereof. For example, each of the light-emitting layers 142 of the light-emitting structures 140B, 140R and 140G may further include at least one of a hole injection layer (HIL), a hole transport layer (HTL), an electron transport layer (ETL) and an electron injection layer (EIL), in addition to the emitting material layer (EML).

The upper electrodes 143 of the light-emitting structures 140B, 140R and 140G may extend along the light-emitting layers 142 of the light-emitting structures 140B, 140R and 140G. For example, the light-emitting structures 140B, 140R and 140G may include upper electrodes 143, which extend over the sub-pixel areas BSP, RSP and GSP of the pixel area PA.

The upper electrodes 143 of the light-emitting structures 140B, 140R and 140G may include materials different from the materials of the lower electrodes 141B, 141R and 141G of the light-emitting structures 140B, 140R and 140G. For example, the lower electrodes 141B, 141R and 141G of the light-emitting structures 140B, 140R and 140G may be anodes, and the upper electrodes 143 of the light-emitting structures 140B, 140R and 140G may be cathodes. The upper electrodes 143 of the light-emitting structures 140B, 140R and 140G may include a transparent material.

The color filters 170B, 170R and 170G may convert the light generated by the corresponding light-emitting structures 140B, 140R and 140G into light of a specific color. Each of the color filters 170B, 170R and 170G may be disposed on a corresponding one of the light-emitting structures 140B, 140R and 140G. The adjacent color filters 170B, 170R and 170G, which are disposed in the corresponding sub-pixel area BSP, RSP and GSP of the lower substrate 110, may include different materials from one another. For example, the color filters 170B, 170R and 170G may include a blue color filter 170B on the blue light-emitting structure 140B, a red color filter 170R on the red light-emitting structure 140R, and a green color filter 170G on the green light-emitting structure 140G. The blue color filter 170B then can convert the light from the blue light-emitting structure 140B into blue light, the red color filter 170R then can convert the light from the red light-emitting structure 140R into red light, and the green color filter 170G then can convert the light from the green light-emitting structure 140G into green light. The light output from each of the blue, red and green light-emitting structures 140B, 140R and 140G may be white light but is not limited thereto. As such, a combination of the light-emitting structure 140B, 140R or 140G and the corresponding color filter 170B, 170R or 170G can be referred to as a non-white color light emitting structure for emitting blue, red or green light.

The display device according to the embodiment of the present invention may further include a lower protecting film 160 for preventing the light-emitting structures 140B, 140R and 140G from being damaged in the process of forming the color filters 170B, 170R and 170G. For example, the lower protecting film 160 may extend along the upper electrodes 143 of the light-emitting structures 140B, 140R and 140G. The lower protecting film 160 may have a structure in which an inorganic insulating film and an organic insulating film are stacked. For example, the lower protecting film 160 may have a structure in which an organic insulating film is stacked between inorganic insulating films including ceramic. The lower protection film 160 may include a transparent material.

The white light-emitting structure 180 may realize white color. For example, the white light-emitting structure 180 may include a lower white electrode 181, a white light-emitting layer 182, and an upper white electrode 183, which are sequentially stacked.

The white light-emitting structure 180 may be disposed on the color filters 170B, 170R and 170G of each pixel area PA. For example, the white light-emitting structure 180 may extend over the blue sub-pixel area BSP, the red sub-pixel area RSP, and the green sub-pixel area GSP of the lower substrate 110. The white light-emitting structure 180 may overlap the light-emitting structures 140B, 140R and 140G. In one example, the lower white electrode 181, the white light-emitting layer 182 and the upper white electrode 183 of the white light-emitting structure 180 extend to cover the entire sub-pixel areas BSPs, RSPs, and GSPs.

For instance, all the layers (or one or more layers such as the white light-emitting layer 182) of the white light-emitting structure 180 continuously extend along all the sub-pixel areas and pixel areas including all the boundaries between the pixel areas. As a result, the white light emitting structure 180 can cover the entire pixel areas continuously. Preferably this feature is present in all the embodiments of the present invention.

The display device according to the embodiment of the present invention may be constituted such that the light-emitting structures 140B, 140R and 140G, the color filters 170B, 170R and 170G and the white light-emitting structure 180 are sequentially stacked in the corresponding sub-pixel areas BSP, RSP and GSP of the lower substrate 110 for all the pixel areas (PAs). Therefore, in the display device according to the embodiment of the present invention, the color filters 170B, 170R and 170G may prevent a reflection of the light passing through the white light-emitting layer 182. Thus, the display device according to the embodiment of the present invention may prevent the reflection of external light in the area, in which the white light-emitting layer 182 is positioned.

Further, in the display device according to the embodiment of the present invention, the white light-emitting structure 180 may be driven independently from the light-emitting structures 140B, 140R and 140G in the corresponding sub-pixel areas BSP, RSP and GSP of the lower substrate 110. That is, in the display device according to the embodiment of the present invention, the light-emitting structures 140B, 140R and 140G in the corresponding sub-pixel areas BSP, RSP and GSP of the lower substrate 110 may not be driven while the white light-emitting structure is driven in order to realize white color. That is, the sub-pixel areas BSP, RSP and GSP can respectively realize blue color, red color and green color, but can also each realize different colors such as white color depending on which light-emitting structure is driven.

Therefore, the display device according to the embodiment of the present invention may prevent a reduction in the lifespan of the light-emitting structures 140B, 140R and 140G in the corresponding sub-pixel areas BSP, RSP and GSP of the lower substrate 110.

In addition, in the display device according to the embodiment of the present invention, since the white light-emitting structure 180 that realizes white color is positioned on the light-emitting structures 140B, 140R and 140G that realize specific colors which are not white, each pixel area PA may not include a separate white sub-pixel area (e.g., adjacent to the green, blue, or red sub-pixel area) for realizing white color. As a result, in the display device according to the embodiment of the present invention, the areas of the light-emitting structures 140B, 140R and 140G realizing specific colors, which are not white, may be increased.

Thus, the display device according to the embodiment of the present invention is characterized in that the light generated from the light-emitting structures 140B, 140R and 140G realizing specific colors, which are not white, is emitted outside through the white light-emitting structure 180. Further, the areas of the light-emitting structures 140B, 140R and 140G realizing specific colors, which are not white, are increased. Moreover, a polarizing plate having a low transmittance (which is used in the related art display devices in order to prevent the reflection of external light) is not needed in the display device of the present invention, thereby enhancing the overall light emission efficiency of the display device.

At least one of the lower white electrode 181, the white light-emitting layer 182, and the upper white electrode 183 of the white light-emitting structure 180 may include a transparent material. The upper white electrode 183 may include a different material from the lower white electrode 181. For example, the lower white electrode 181 may be a cathode, and the upper white electrode 183 may be an anode.

The display device according to the embodiment of the present invention may further include a pixel-protecting film 190 on the white light-emitting structure 180. The pixel-protecting film 190 may prevent moisture from entering the white light-emitting layer 182 of the white light-emitting structure 180. For example, the pixel-protecting film 190 may include an inorganic film and/or may have a multi-layer structure. The pixel-protecting film 190 may include a transparent material.

The upper substrate 210 may be positioned on the pixel-protecting film 190. The upper substrate 210 may include an insulating material. The upper substrate 210 may include a transparent material. For example, the upper substrate 210 may include glass or plastic.

The display device according to the embodiment of the present invention may further include an adhesive layer 300 between the pixel-protecting film 190 and the upper substrate 210. Due to the adhesive layer 300, the upper substrate 210 may adhere to a lower array, which includes the lower substrate 110, the thin film transistors 120, the light-emitting structures 140B, 140R and 140G, and the white light-emitting structure 180. For example, the adhesive layer 300 may include thermosetting resin. The adhesive layer 300 may further include a moisture-absorbing material. The adhesive layer 300 may include a transparent material.

Consequently, in the display device according to the embodiment of the present invention, the light-emitting structures 140B, 140R and 140G realizing specific colors, which are not white, are disposed in the corresponding sub-pixel areas BSP, RSP and GSP of the lower substrate 110, and the white light-emitting structure 180 is disposed above the light-emitting structures 140B, 140R and 140G, thereby preventing degradation of image definition due to the reflection of external light while preventing deterioration of light emission efficiency or reduction of lifespan of the display device.

The display device according to the embodiment of the present invention has been described as having a constitution in which the white light-emitting structure 180 is positioned on the lower substrate 110 including the color filters 170B, 170R and 170G. However, other variations are possible and are part of the present invention, which will be described referring to FIGS. 2 to 5.

Figure 2:
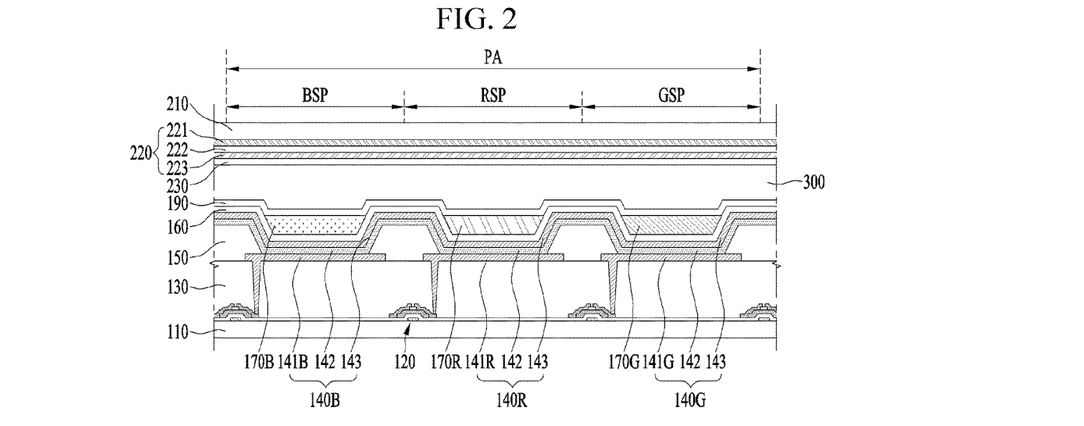
FIGS. 2 to 5 are views respectively showing various examples of sections of display devices according to another embodiment of the present invention.

FIG. 2 is a view schematically showing an example of a section of a display device according to an embodiment of the present invention. As shown in FIG. 2, the display device according to this embodiment of the present invention may include a white light-emitting structure 220 directly below the lower surface of the upper substrate 210 facing the lower substrate 110. The white light-emitting structure 220 has the same layers as the white light-emitting structure 180, although the layers' orientations and locations may be different.

More specifically, in the display device according to this embodiment of the present invention, the white light-emitting structure 220 may include a lower white electrode 221, which is in direct contact with the upper substrate 210, and a white light-emitting layer 222 and an upper white electrode 223, which are sequentially stacked on the lower white electrode 221. In an example, all the layers (or one or more layers such as the white light-emitting layer 222) of the white light-emitting structure 220 continuously extend along all the sub-pixel areas and pixel areas including all the boundaries between the pixel areas. As a result, the white light emitting structure 180 can cover the entire pixel areas continuously. Further, for example, in forming the white light-emitting structure 220, the layers 221, 222 and 223 may be first sequentially stacked on the upper substrate 210, and then this stacked structure is adhered, via an adhesive layer 300, to the pixel protection film 190 with all layers formed below the film 190 as shown in FIG. 2. That is, in the display device according to this embodiment of the present invention, the adhesive layer 300 may be positioned between the pixel-protecting film 190 and the white light-emitting structure 220. Therefore, the display device according to this embodiment of the present invention may prevent the light-emitting structures 140B, 140R and 140G and the color filters 170B, 170R and 170G from being damaged in the process of forming the white light-emitting structure 220. Thus, the display device according to this embodiment of the present invention may effectively prevent deterioration of image definition attributable to the reflection of external light. The display device according to one example of the present invention may further include another pixel-protecting film 230, which is positioned directly below (i.e., in direct contact with) the white light-emitting structure 220.

The display device according to the embodiment of the present invention has been described that each of the color filters 170B, 170R and 170G is a liner shape extending along the upper electrodes 143 of the light-emitting structures 140B, 140R and 140G. However, as shown in FIG. 2, the display device may be constituted such that the color filters 170B, 170R and 170G are positioned between the bank insulating films 150, which cover the edges of the lower electrodes 141B, 141R and 141G of the corresponding light-emitting structures 140B, 140R and 140G. Other components such as the light-emitting structures 140B, 140R and 140G, the bank insulating films 150, the thin film transistors 120 and the planarization film 130 of FIG. 2 are the same as those of FIG. 1. In the display device of FIG. 2, the space defined by stepped portions formed by the bank insulating films 150 may be filled with the color filters 170B, 170R and 170G. For example, the entire upper surfaces of the color filters 170B, 170R and 170G may be parallel or substantially parallel to the upper surface of the lower substrate 110. The pixel protection film 190 covers and is in direct contact with the color filters 170B, 170R and 170G as well as portions of the lower protection film 160. Therefore, the display device according to this embodiment of the present invention may prevent the color filters 170B, 170R and 170G from being misaligned from one other and thus may efficiently prevent deterioration of definition by the display device.

Figure 3:
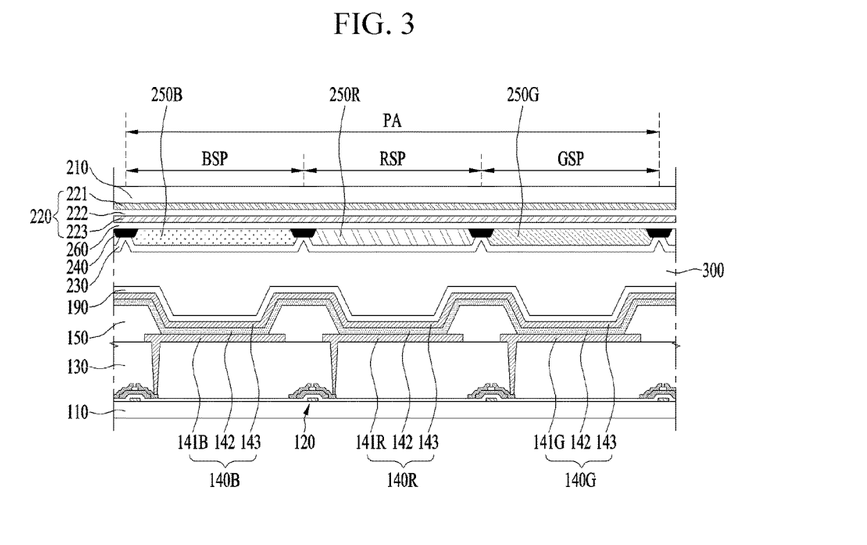

FIG. 3 is a view schematically showing another example of a section of a display device according to an embodiment of the present invention. As shown in FIG. 3, the display device may include a white light-emitting structure 220 and color filters 250B, 250R and 250G, which are sequentially stacked on the surface of the upper substrate 210 that faces the lower substrate 110. The white light-emitting structure 220 of FIG. 3 has the same layers and orientation as the white light-emitting structure 220 of FIG. 2. In an example, all the layers (or one or more layers such as a white light-emitting layer 222) of the white light-emitting structure 220 continuously extend along all the sub-pixel areas and pixel areas including all the boundaries between the pixel areas. As a result, the white light emitting structure 180 can cover the entire pixel areas continuously.

The display device according to this example of the present invention may further include black matrices 240, which are positioned between the blue color filter 250B, the red color filter 250R and the green color filter 250G. In order to prevent the white light-emitting structure 220 from being damaged in the process of forming the color filters 250B, 250R and 250G, the display device may further include an upper protecting film 260, which is positioned between the white light-emitting structure 220 and the color filters 250B, 250R and 250G. Therefore, the display device according to this example of the present invention may prevent light-emitting structures 140B, 140R and 140G from being damaged in the process of forming the white light-emitting structure 220 and the color filters 250B, 250R and 250G. The display device may further include a pixel-protecting film 230, which is positioned directly below (in direct contact with) the black matrices 240 and the color filters 250B, 250R and 250G.

Other components of the display device of FIG. 3 such as the light-emitting structures 140B, 140R and 140G, the bank insulating films 150, the thin film transistors 120, the planarization film 130 and the lower substrate 110 of FIG. 3 are the same as those of FIG. 2. The display device of FIG. may further include another pixel protection film 190 directly on the upper electrodes 143 of the pixel areas PAs.

Thus, the display device according to this example of the present invention may effectively prevent reflection of light passing through the white light-emitting layer 222.

The display device according to the embodiments of the present invention has been described as having a constitution in which the color filters 170B/250B, 170R/250R and 170G/250G are positioned in the corresponding sub-pixel areas BSP, RSP and GSP of the lower substrate 110. However, other variations are possible which will be described referring to FIGS. 4 and 5.

Figure 4:
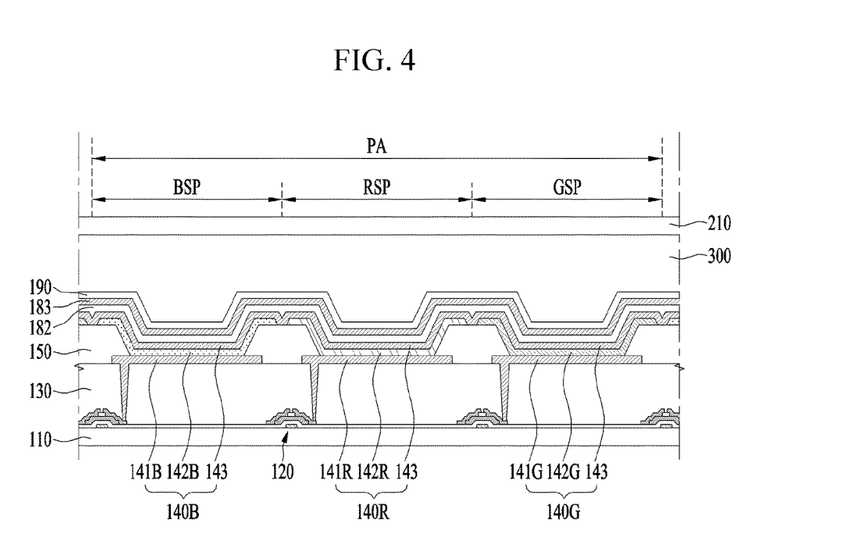

FIG. 4 is a view schematically showing another example of a section of a display device according to an embodiment of the present invention.

As shown in FIG. 4, the display device may not include the color filters 170B/250B, 170R/250R and 170G/250G of the previous examples. Instead, the display device according to this example of the present invention may be constituted such that light-emitting structures 140B, 140R and 140G in the corresponding sub-pixel areas BSP, RSP and GSP include light-emitting layers 142B, 142R and 142G for realizing different colors. For example, the blue light-emitting structure 140B may include a blue light-emitting layer 142B for emitting blue color light, the red light-emitting structure 140R may include a red light-emitting layer 142R for emitting red color light, and the green light-emitting structure 140G may include a green light-emitting layer 142G for emitting green color light. Here the light-emitting layers 142B, 142R and 142G of the light-emitting structures 140B, 140R and 140G may be separated from one another such that upper electrodes 143 of the light-emitting structures 140B, 140R and 140G disposed on the light-emitting layers 142B, 142R and 142G contact upper portions of a bank insulating film 150 near boundary areas of the sub-pixel areas BSP, RSP and GSP. Each of the light-emitting structures 140B, 140R and 140G further includes an upper electrode 143 disposed on the light-emitting layers 142B, 142R and 142G. Further, a white light-emitting layer 182 is disposed on the upper electrodes 143. Therefore, the display device according to this example of the present invention may prevent reflection of the light passing through the white light-emitting layer 182 by using the light-emitting layers 142B, 142R and 142G of the light-emitting structures 140B, 140R and 140G. Thus, the display device according to this example of the present invention may efficiently prevent the reflection of external light.

The display device according to some previous examples of the present invention has been described as having a constitution in which the white light-emitting structure 180 includes the lower electrode 181, the white light-emitting layer 182, and the upper electrode 183, which are sequentially stacked. However, in the example of FIG. 4, the display device may not include the lower electrode 181, but may include just the white light-emitting layer 182 and the upper (white) electrode 183, which are sequentially stacked on the upper electrodes 143 of the light-emitting structures 140B, 140R and 140G. As such, the white light-emitting structure in this example may include the white light-emitting layer 182 and the upper white electrode 183, where the upper electrodes 143 function as the lower white electrode. Further, the upper white electrode 183 may include a different material than the upper electrodes 143 of the light-emitting structures 140B, 140R and 140G. In addition, the upper white electrode 183 may perform the same function as the lower electrodes 141B, 141R and 141G of the light-emitting structures 140B, 140R and 140G. For example, the lower electrodes 141B, 141R and 141G of the light-emitting structures 140B, 140R and 140G and the upper white electrode 183 may be formed with a same material or may be anodes, whereas the upper electrodes 143 of the light-emitting structures 140B, 140R and 140G may be formed with a same material or may be cathodes. Further, in an example, all the layers (or one layer such as the white light-emitting layer 182) of the white light-emitting structure continuously extend along all the sub-pixel areas and pixel areas including all the boundaries between the pixel areas. As a result, the white light emitting structure can cover the entire pixel areas continuously.

Therefore, the display device according to this embodiment of the present invention may have an advantage of reduced manufacturing costs and time and may efficiently prevent the deterioration of image definition which may be caused due to the reflection of external light.

Other components of the display device of FIG. 4 such as the bank insulating films 150, the thin film transistors 120, the planarization film 130 and the lower substrate 110 may be the same as those of FIG. 2 or 3. The display device of FIG. 4 may further include a pixel protection film 190, an adhesive layer 300, and an upper substrate 210 disposed on the upper electrodes 183 of the pixel areas PAs. Further the light-emitting structures 140B, 140R and 140G of FIG. 4 (and FIG. 5 below) can be referred to as color light emitting structures since they output different light colors excluding white color.

Figure 5:
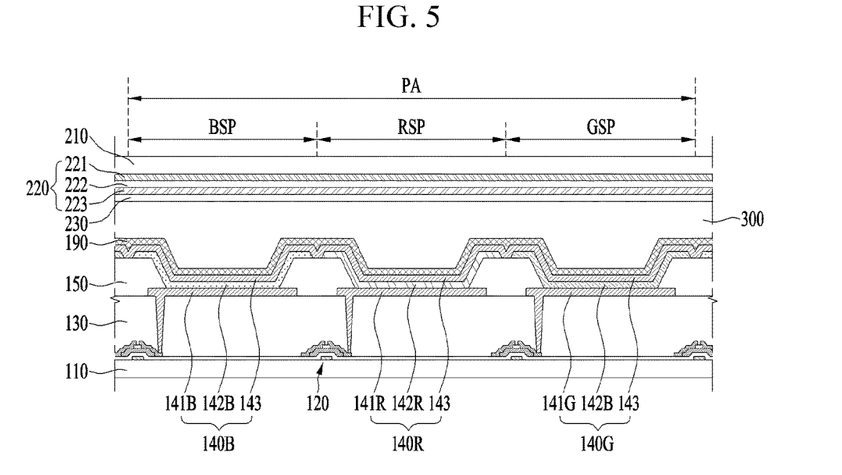

FIG. 5 is a view schematically showing another example of a section of a display device according to an embodiment of the present invention.

As shown in FIG. 5, the display device according to another example of the present invention may be constituted such that the light-emitting structures 140B, 140R and 140G positioned in the corresponding sub-pixel areas BSP, RSP and GSP include light-emitting layers 142B, 142R and 142G for realizing different colors and such that a white light-emitting structure 220 is positioned below the lower surface of the upper substrate 210 that faces the lower substrate 110 similar to the positioning of the white-emitting structure 220 of FIG. 2. For example, the display device of FIG. 5 is the same as or similar to the display device of FIG. 4, except that instead of the white light-emitting layer 182 and the upper electrode 183 of FIG. 4 the white light-emitting structure 220 of FIG. 2 is included in the same manner in the display device of FIG. 5. The display device of FIG. 5 has the same light-emitting structures 140B, 140R and 140G and the thin film transistor 120 structures as FIG. 4, and may further include a pixel protection film 190 on the upper electrodes 143 of the light-emitting structures 140B, 140R and 140G. Therefore, the display device according to this example of the present invention may effectively prevent the reflection of the light passing through the white light-emitting layer 222 of the white light-emitting structure 220.

In the examples of FIGS. 4 and 5, a separate color filter is not included since the light-emitting layers 142B, 142R and 142G themselves can emit different color lights such as blue, red and green color lights. However, the invention is not limited thereto and other variations are possible. For instance, one or more color filters can be provided in the display devices of FIGS. 4 and 5. Further, the light-emitting layers 142B, 142R and 142G are separated from each other.

Moreover, in all the embodiments of the present invention, it has been described that all the white and no-white light-emitting structures for realizing red, blue, green and white color lights can be selectively and independently driven from each other. In one example, for each sub-pixel area, either the white light-emitting structure for emitting white color light, or the (non-white color) light-emitting structure for emitting non-white color such as blue, green or red color light, can be turned on at a given time. In another example, for each sub-pixel area, both the white light-emitting structure for emitting white color light and the (non-white color) light-emitting structure for emitting non-white color such as blue, green or red color light, can be turned on at a given time. As a result, each sub-pixel can emit at a given time the white light or the designated non-white color light such as blue, red or green, or the combination of these two lights. Although the four color lights (white, red, green and blue) have been discussed, the invention is not limited thereto and other colors can be emitted by one or more light-emitting structures of the present invention.

As is apparent from the above description, the present invention provides a display device, in which light-emitting structures or color filters, which are positioned in sub-pixel areas, are capable of preventing the reflection of light passing through a white light-emitting layer. Accordingly, the display device of the present invention is capable of preventing the reflection of external light attributable to the white light-emitting layer. As a result, the display device of the present invention has an advantageous effect of improving definition of the display device, lowering power consumption, and increasing the lifespan of the display device.

It will be apparent to those skilled in the art that various modifications and variations can be made in the present invention without departing from the spirit or scope of the invention. Further, any feature discussed in connection with one example/embodiment may be equally applied to any other example/embodiment of the present invention. Thus, it is intended that the present invention covers the modifications and variations of this invention provided they come within the scope of the appended claims and their equivalents.

What is claimed is:

1. A display device comprising:
   a plurality of pixel areas disposed on a lower substrate, each pixel area including a plurality of sub-pixel areas for displaying images;
   a plurality of light emitting structures disposed respectively in the sub-pixel areas of each pixel area, and including a light emitting layer configured to output at least one color light;
   a plurality of color filters disposed correspondingly to the light emitting structures, and configured to convert the at least one color light output from the light emitting structures into different color lights; and
   a white light emitting structure including a white light emitting layer configured to output white color light,
   wherein the white light emitting structure covers all the light emitting structures and the color filters.

2. The display device of claim 1, wherein the white light emitting structure further includes:
   a lower electrode in electrical contact with a thin film transistor of each sub-pixel, and
   an upper electrode disposed on the lower electrode,
   wherein the white light emitting layer is disposed between the lower electrode and the upper electrode.

3. The display device of claim 2, wherein the color filters are disposed below the lower electrode of the white light emitting structure.

4. The display device of claim 1, further comprising:
   a pixel protection layer disposed on the white light emitting structure;
   an upper substrate; and
   an adhesive layer for attaching the upper substrate to the pixel protection layer.

5. The display device of claim 1, wherein a number of the sub-pixel areas that exist in each pixel area is three.

6. The display device of claim 1, wherein each of the sub-pixel areas selectively outputs at least two different light colors depending on which light emitting structure is driven, and
   wherein the at least two different light colors include:
   blue light color and white light color,
   red light color and white light color, or
   green light color and white light color.

7. The display device of claim 1, further comprising:
   an upper substrate, wherein the white light emitting structure is disposed below a lower surface of the upper substrate; and
   an adhesive layer disposed between the white light emitting structure and the light emitting structures.

8. The display device of claim 7, wherein the color filters are disposed below the adhesive layer.

9. The display device of claim 7, further comprising:
   black matrices disposed between the color filters,
   wherein the color filters and the black matrices are disposed above the adhesive layer.

10. A display device comprising:
    a plurality of pixel areas for displaying images, each pixel area including a plurality of sub-pixel areas disposed adjacent to each other, each sub-pixel area including:
    a thin film transistor disposed on a lower substrate, and
    a non-white color light emitting structure connected to the corresponding thin film transistor, and including a non-white light emitting layer configured to generate non-white color light;
    a white light emitting structure stacked on top of the non-white color light emitting structures, and configured to generate white color light; and
    an upper substrate disposed above the white light emitting structure,
    wherein the white light emitting structure includes a white light emitting layer that continuously extends along all the sub-pixel areas.

11. The display device of claim 10, wherein each non-white color light emitting structure includes:
    a light emitting structure in electrical contact with the corresponding thin film transistor, and configured to emit specific light, and
    a color filter disposed on the corresponding light emitting structure, and configured to convert the specific light into the corresponding non-white color light.

12. The display device of claim 11, wherein all the light emitting structures of the non-white color light emitting structures emit the same specific light having the same white color.

13. The display device of claim 10, further comprising:
    a pixel protection layer disposed on the white light emitting structure; and
    an adhesive layer for attaching the upper substrate to the pixel protection layer.

14. The display device of claim 10, wherein a number of the sub-pixel areas that exist in each pixel area is three.

15. A display device comprising:
    a plurality of pixel areas for displaying images, each pixel area including a plurality of sub-pixel areas, each sub-pixel area including:
    a thin film transistor disposed on a lower substrate, and
    a color light emitting structure connected to the corresponding thin film transistor, and including a light emitting layer configured to output color light; and
    a white light emitting structure independently driven from the color light emitting structures, and including a white light emitting layer configured to output white color light,
    wherein the white light emitting structure covers all the color light emitting structures.

16. The display device of claim 15, wherein the display device excludes a color filter.

17. The display device of claim 15, wherein each color light emitting structure further includes:
    a lower electrode connected to the corresponding thin film transistor, and
    an upper electrode disposed on the lower electrode,
    wherein the light emitting layer is disposed between the lower electrode and the upper electrode.

18. The display device of claim 17, wherein the white light emitting structure further includes:
    an upper white electrode disposed on the white light emitting layer,
    wherein the white light emitting layer is in contact with the upper electrodes of the color light emitting structures, and
    wherein the upper electrodes of the color light emitting structures function as a lower white electrode of the white light emitting structure.

19. The display device of claim 15, further comprising:
    an upper substrate, wherein the white light emitting structure is disposed below a lower surface of the upper substrate; and
    an adhesive layer disposed between the white light emitting structure and the color light emitting structures.

20. The display device of claim 15, wherein the light emitting layers of the color light emitting structures are separated from each other.

* * * * *